(12) United States Patent
Blakes

(10) Patent No.: US 8,143,895 B2
(45) Date of Patent: Mar. 27, 2012

(54) COIL NODE VOLTAGE OUTPUTS FOR SUPERCONDUCTING MAGNETS

(75) Inventor: Hugh Alexander Blakes, Oxfordshire (GB)

(73) Assignee: Siemens Plc., Frimley, Camberley (GB)

( * ) Notice: Subject to any disclaimer, the term of this patent is extended or adjusted under 35 U.S.C. 154(b) by 0 days.

(21) Appl. No.: 13/178,836

(22) Filed: Jul. 8, 2011

(65) Prior Publication Data

US 2012/0035058 A1    Feb. 9, 2012

(30) Foreign Application Priority Data

Aug. 5, 2010  (GB) .................................. 1013206.6

(51) Int. Cl.
*G01V 3/00* (2006.01)

(52) U.S. Cl. ........................................ 324/319; 324/318

(58) Field of Classification Search .......... 324/300–322; 600/407–445; 361/58, 19, 115, 141; 335/261, 335/299

See application file for complete search history.

(56) References Cited

U.S. PATENT DOCUMENTS

| | | | | |
|---|---|---|---|---|
| 5,532,664 | A | * | 7/1996 | Buckles et al. ................ 335/216 |
| 5,642,249 | A | * | 6/1997 | Kuznetsov ...................... 361/58 |
| 5,731,939 | A | * | 3/1998 | Gross et al. ..................... 361/19 |

* cited by examiner

*Primary Examiner* — Brij Shrivastav
(74) *Attorney, Agent, or Firm* — Schiff Hardin LLP

(57) ABSTRACT

In a superconducting magnet assembly a plurality of superconducting coils, joined in series, are housed within a cryostat. A coil node between two electrically adjacent of the superconducting coils provides an input voltage. A coil node voltage output is provided comprising a series resistor connected between the coil node and a further node. A non-linear element is connected between the further node and a ground voltage, and an output connector is electrically connected to the further node and traverses a boundary of the cryostat.

10 Claims, 5 Drawing Sheets

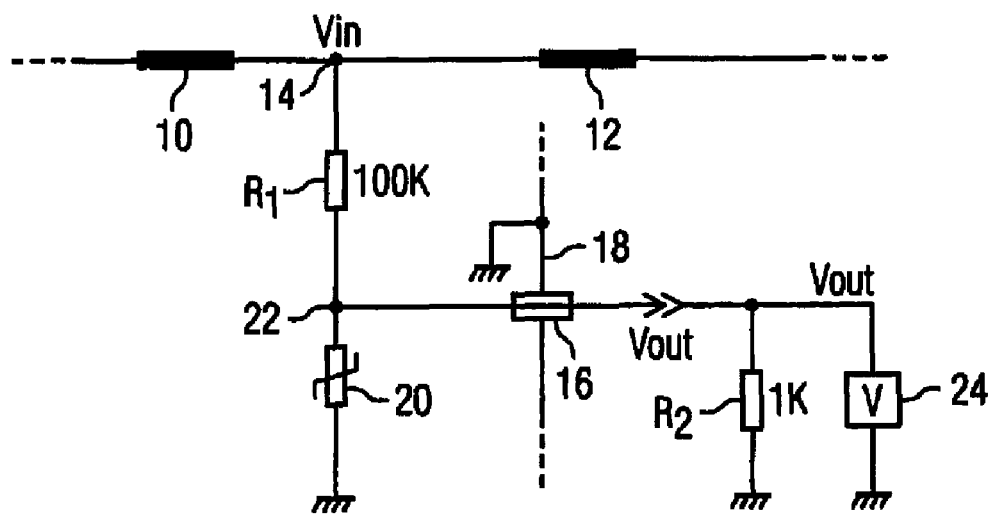
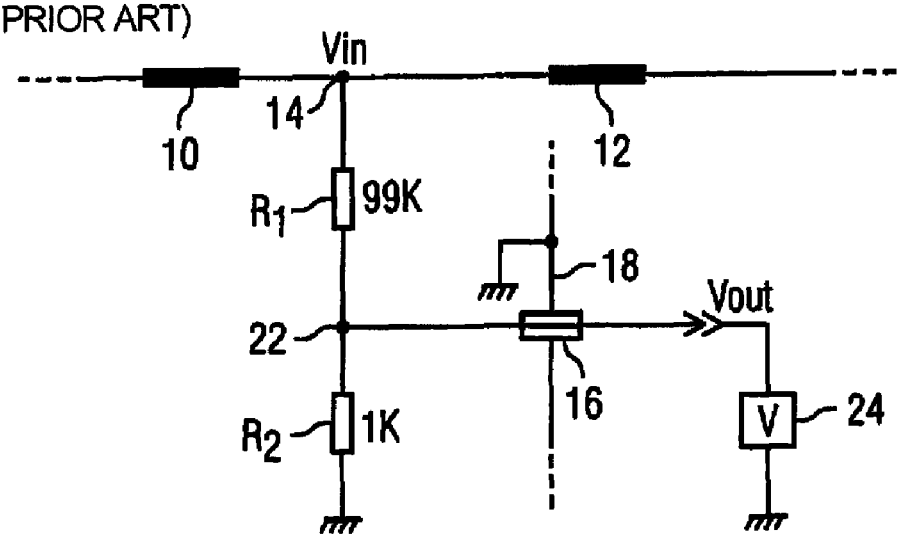

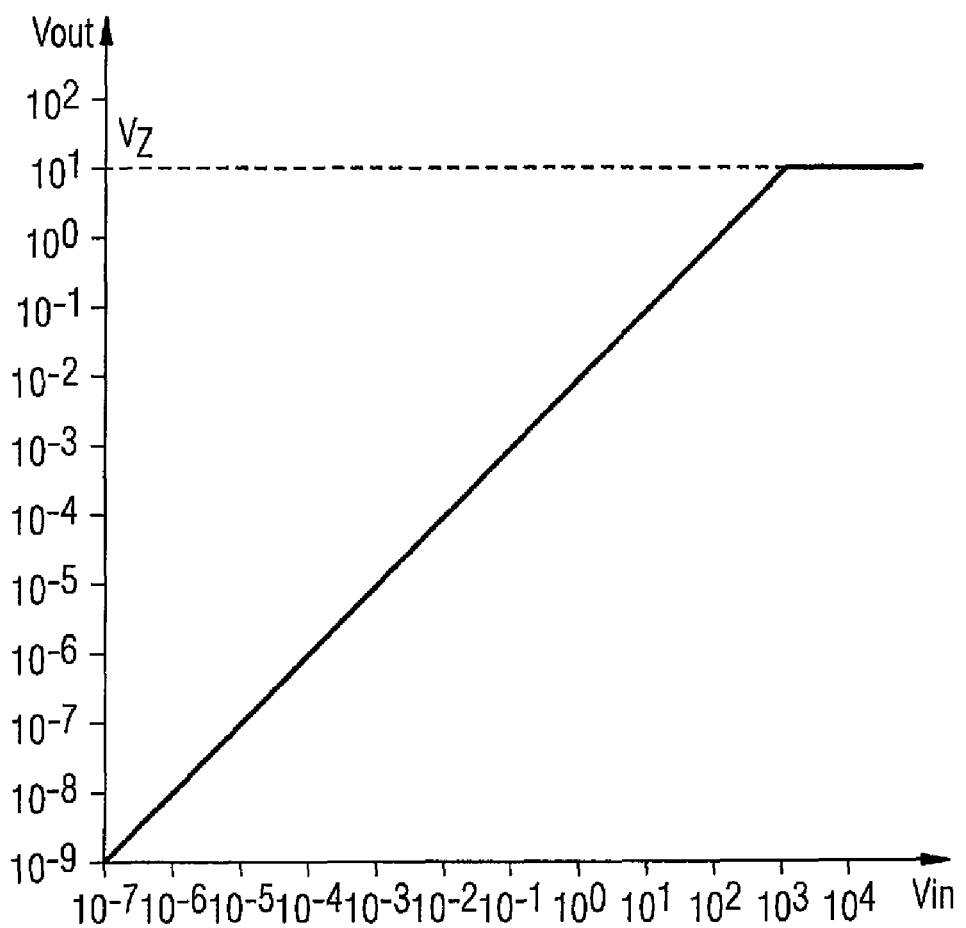

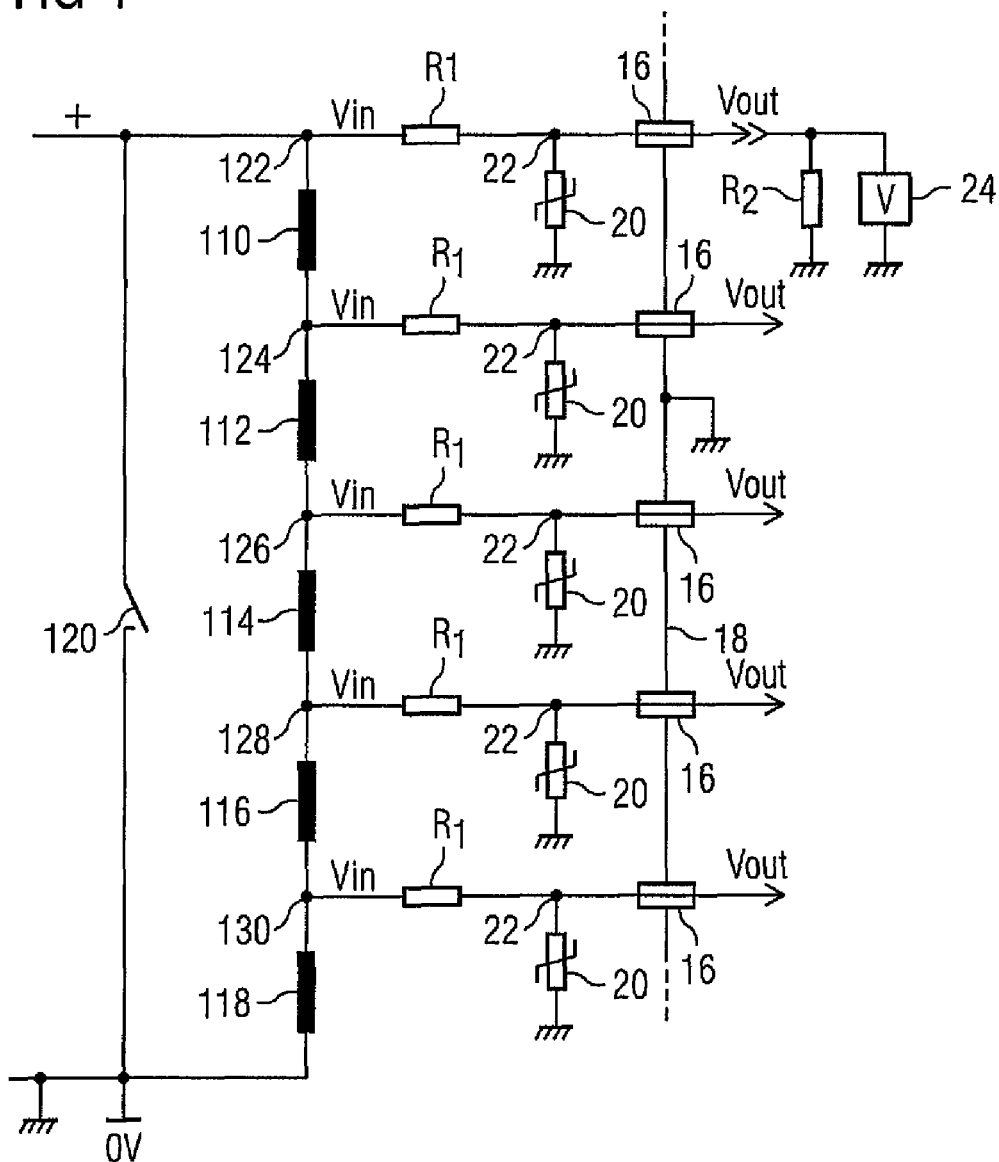

COIL NODE VOLTAGE OUTPUTS FOR SUPERCONDUCTING MAGNETS

BACKGROUND

Superconducting magnets, such as those used to generate homogenous background magnetic fields in MRI systems, are usually constructed from several separate coils electrically connected in series. The magnet structure is housed within a cryostat which keeps the magnet cooled to a temperature at which the coils are superconducting. In many magnets, the coils are housed within a cryogen vessel partially filled with liquid cryogen, and partially filled with a gaseous cryogen.

It is desirable to have electrical access to each coil junction in order to measure quench voltages and diagnose which coil or section of coil quenched first. Known systems have provided simple electrical connections from nodes between coils to simple high-voltage lead-throughs, arranged to carry voltages of up to several kilovolts to the exterior of the cryostat. Since these voltages can reach several kilovolts, appropriate insulation in a gaseous cryogen atmosphere, for example helium, is extremely challenging and dangerous. Helium gas has a much lower breakdown voltage than air, so the required standard of insulation is much greater than would be the case in air. Another disadvantage of such an arrangement is that the necessary high voltage connectors introduce a significant heat leak path into the cryostat.

This problem has conventionally been addressed by providing a voltage divider near each node between coils. FIG. 5 illustrates such a conventional arrangement. A node 14 between coils 10, 12, is electrically connected to a first resistor R1. R1 is connected to a ground voltage, typically the voltage of the cryostat body, through a second resistor R2. Resistor R1 is of much larger value than R2, for example R1=100MΩ, R2=100 kΩ. Node 22, between R1 and R2, is electrically connected to a connector 16, which carries the voltage at node 22 through the boundary 18 of the cryostat. A voltage measuring device 24, such as a data logger, may be attached to the connector 16 on the outside of the cryostat, to measure voltages at the connector.

The resistors R1 and R2, forming the voltage divider, are typically placed on a small circuit board close to the node 14 between coils. Any voltage Vin derived from the node 14 is divided in proportion to resistors R1 and R2, and a fraction of that voltage Vin is supplied to the connector 16. In the illustrated embodiment, R1=100MΩ, R2=100 kΩ and so the voltage Vout appearing at the voltage measuring device is about one one-thousandth of the voltage at the node 14, that is, Vout≈Vin/1000. Such large value resistors are used to limit the current which may flow through the connector. If a 5 kV voltage is applied through a 100MΩ resistor to ground, a current of only 50 µA will flow, which is considered safe.

Such an arrangement ensures that even voltages of 5 kV, which may arise during a quench, are scaled to a safe value of 5V before they leave the cryogen vessel. While such high voltages are scaled to a small, safe value, any small voltages Vin which may be generated, by coil movement for instance, will also be reduced by the same ratio when measured.

It is known that analyzing the small voltages generated by many phenomena and fault modes such as: accurate individual coil ramp voltages, coil movement, field decay, short circuits, flux jumps and thermal quench initiation, can reveal a great deal of information leading to accurate diagnosis.

This information is not available after attenuation in the manner shown in FIG. 5 as real signals Vout≈Vin/1000 derived from such small voltages are lost in electrical and thermal noise of similar magnitude and also present in the attenuated voltages Vout presented for measurement.

SUMMARY

In a superconducting magnet assembly a plurality of superconducting coils, joined in series, are housed within a cryostat. A coil node between two electrically adjacent of the superconducting coils provides an input voltage. A coil node voltage output is provided comprising a series resistor connected between the coil node and a further node. A non-linear element is connected between the further node and a ground voltage, and an output connector is electrically connected to the further node and traverses a boundary of the cryostat.

The above, and further, objects, characteristics and advantages of the present invention will become more apparent from the following descriptions of certain embodiments thereof, in conjunction with the appended drawings

BRIEF DESCRIPTION OF THE DRAWINGS

FIG. 1 shows a circuit diagram of an example embodiment of the present invention;

FIG. 3 shows a voltage characteristic of a coil voltage output from a superconducting magnet according to an embodiment of the present invention;

FIG. 4 shows a more complete circuit diagram of an embodiment of the present invention;

FIG. 5 shows a circuit diagram of an example of a conventional coil voltage output arrangement.

DESCRIPTION OF THE PREFERRED EMBODIMENTS

Figure 2:
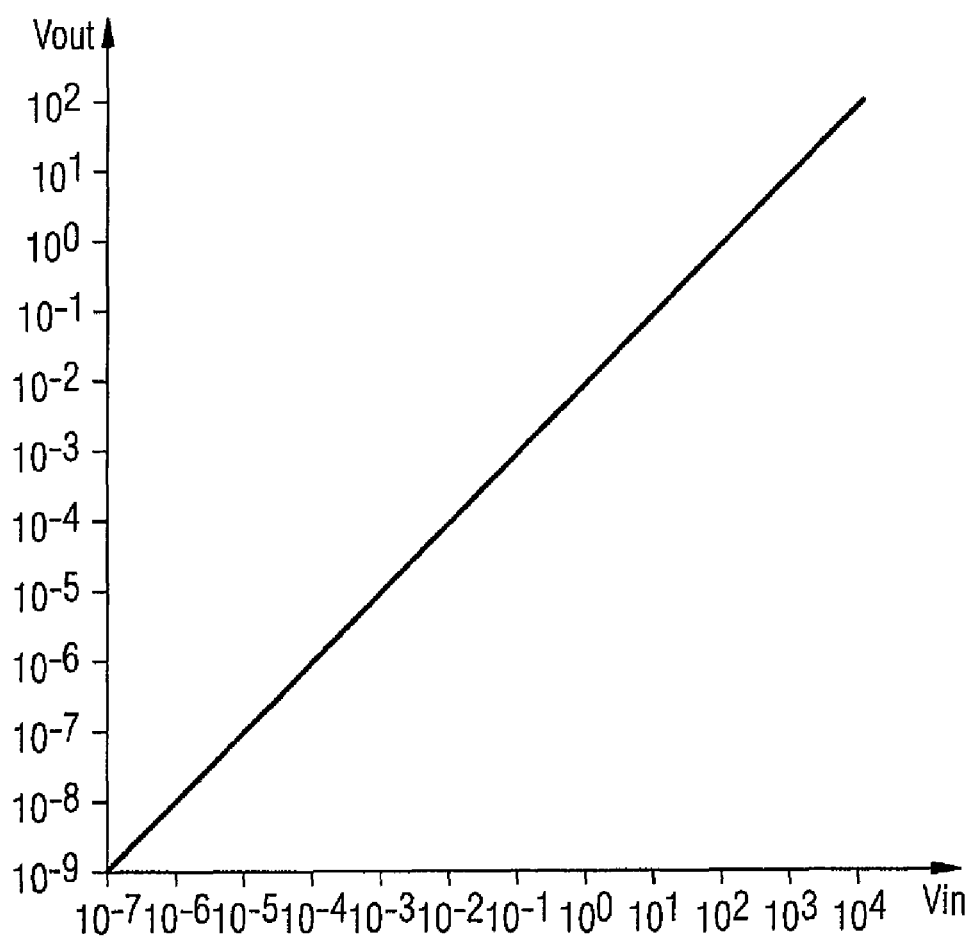
FIG. 2 shows a voltage characteristic of a conventional coil voltage output from a superconducting magnet, in an arrangement as illustrated in FIG. 5.

For the purpose of promoting an understanding of the principles of the invention, reference will now be made to preferred embodiments/best mode illustrated in the drawings and specific language will be used to describe the same. It will nevertheless be understood that no limitation of the scope of the invention is thereby intended, and such alterations and further modifications in the illustrated method and such further applications of the principles of the invention as illustrated as would normally occur to one skilled in the art to which the invention relates are included.

The example embodiment provides a means of enabling un-attenuated, low noise, small voltages to be brought out of the cryostat, while limiting any high voltages produced during a quench, ensuring that only safe voltages are provided to outside the cryostat. This enables high speed, real time, detailed measurement of voltages even in the microvolt range on the coil junctions even though this part may suddenly leap up to several kilovolts in seconds.

The example embodiment provides an arrangement for supplying signals comprising un-attenuated, low noise, small voltages from individual coils that form a superconducting magnet to be brought out of the cryostat, while attenuating any high voltages from the coils, which may be present in the signals, such as voltages produced during a quench.

This is achieved, in embodiments of the present invention, by applying a coil node voltage to be measured to an input of a series resistor R1, for example of about 100 kΩ, and providing a second resistor R2 connected between an output of the series resistor and a ground voltage, the second resistor R2 being on the outside of the cryogen vessel. Preferably, the series resistor R1 is mounted in close proximity to the coil node, on the superconducting magnet structure. By providing second resistor R2 on the outside of the cryogen vessel, the attenuation ratio of the resulting voltage divider can be selected by a user in accordance with the required magnitude of voltages which are to be detected.

By placing a low value second resistor R2 between the series resistor R1 and ground, outside the cryostat, only a small proportion of the node voltage Vin will appear as Vout at the connector. This would be useful if quench voltages are sought. By placing a higher value second resistor R2 between the series resistor R1 and ground, outside the cryostat, a larger proportion of the coil node voltage Vin will appear as Vout at the connector. This would be useful when smaller voltages such as individual coil ramp voltages, or voltages caused by coil movement, field decay, short circuits, flux jumps and thermal quench initiation, are sought.

According to an aspect of the present invention example embodiment, the second resistor R2 of the voltage divider made up of series resistor R1 and second resistor R2 is of a resistance selected from among a range of available resistance values, as required.

A non-linear element is positioned near the coil node, connecting the output of the series resistor R1 to the ground voltage. The non-linear element may be a voltage dependant resistor (VDR), zener diode, or any other element that will be very high impedance when the voltage Vin of the coil node is low, for example below about 50V, but low impedance when the voltage Vin is higher, for example above about 50V.

The effect of this non-linear element is that, for low voltages Vin of the coil node, the voltage Vout appearing at the connector is scaled by the voltage divider made up of series resistor R1 and second resistor R2: Vout=Vin. R2/(R1+R2). For larger voltages, the voltage Vout at the connector is limited by a turn-on threshold voltage of the non-linear element. Denoting the threshold voltage of the non-linear element as Vz, Vout=Vz. The voltage Vout at the connector cannot increase beyond Vz, and so can provide measurement of coil node voltages Vin up to a limit of Vin=Vz. (R1+R2)/R2. For example, if the threshold voltage Vz of the non-linear element is 50V and R2=R1, then voltages Vin up to 100V may be measured. If R2=R1/100, then voltages Vin up to 5050V may be measured.

This arrangement provides scaling of small voltages but will limit higher voltages—ones which cause the non-linear element to become conductive. For example, high voltages, such as quench voltages, will cause the non-linear element to have a high conductivity, limiting the voltage seen by measurement equipment at the output of the series resistor to the threshold voltage Vz of the non-linear element. This provides a very important safety feature: the voltage appearing at the connector and accessible from outside the cryostat will never exceed the threshold voltage Vz of the non-linear element, no matter how high the voltage at the coil node may become. A high-value series resistor R1 ensures that no dangerously high currents can be provided to the outside of the cryostat.

As no high voltages are conducted outside of the cryostat, there is no need for high voltage lead-throughs, and much smaller, simpler and safer low-voltage connectors may be used. This reduces the insulation requirements and heat leakage path into the cryostat.

Selection of the second resistor R2, external to the cryostat, allows the attenuation ratio of the resultant voltage divider to be selected as appropriate for any particular measurement task. A low value, such as R2=R1/100 or R1/1000 provides scaling sufficient to observe quench voltages. A high value of R2 allows smaller voltages to be measured with some precision. In the extreme, R2 may be omitted, effectively giving R2=∞. This provides an output voltage Vout which equals the coil node voltage Vin, provided that Vin does not exceed the threshold voltage Vz of the non-linear element. The non-linear element does not take part in the voltage scaling, but acts as a voltage limiter for safety, ensuring that the output voltage Vout cannot exceed Vz. The threshold voltage Vz should be chosen as appropriate to give a sufficiently large range of output voltages to enable meaningful measurements to be made, yet sufficiently low to be safe. A threshold voltage in the range 10V-50V is presently believed to be appropriate. The present invention example embodiment accordingly enables both microvolt and kilovolt ranges to be accurately measured, by changing the value of the second resistor R2, external to the cryostat, thereby changing the attenuation ratio of the voltage divider comprising resistors R1, R2.

FIG. 1 shows an example embodiment of the present invention. Two electrically adjacent coils 10, 12, of a superconducting magnet are shown. The remainder of the superconducting magnet circuitry is not shown. According to the present invention example embodiment, node 14 between the coils is connected to a low-voltage connector 16 through a high-value series resistor R1, for example 100 kΩ. The low-voltage connector 16 provides an electrical path through the boundary 18 of the cryostat to the outside world. Measurement equipment may be connected to the low-voltage connector 16 to detect voltages appearing at the node 14.

A non-linear element 20 is electrically connected between a node 22 and a ground voltage, typically the voltage of the boundary 18 of the cryostat. Node 22 is the node between the resistor R and the low-voltage connector 16. Preferably, both series resistor R1 and non-linear element 20 are mounted on the magnet structure, close to the node 14. Low-voltage connector 16 is electrically connected to node 22.

Furthermore, second resistor R2, of selectable value, is connected between low-voltage connector 16 and ground voltage, outside the cryostat. In the illustrated example, R2=1 kΩ, so that Vout=Vin/101.

Operation of the present invention example embodiment, as illustrated in FIG. 1, may be explained by reference to FIGS. 2 and 3. FIG. 2 shows the conventional relationship between Vin, the voltage appearing at node 14, referenced to the ground voltage, and Vout, the voltage appearing outside the cryostat, when a fixed voltage divider is used. In the conventional arrangement, Vout∝Vin, regardless of whether Vin is $10^{-7}$V, or $10^4$V. In the illustrated relationship, Vout=Vin/100.

FIG. 3 shows the relationship between Vin, the voltage appearing at node 14, referenced to the ground voltage, and Vout, the voltage appearing outside the cryostat, for an example embodiment of the invention, using the same ratio of R1:R2 as the example of FIG. 2. For low values of Vout, for example up to 10V, Vout<Vz, and the non-linear element 20 is open-circuit. Essentially, Vout=Vin/100 for these values.

For higher values of Vout, where Vin.R2/(R1+R2)>Vz, the non-linear element 20 becomes conductive. In the illustrated example, Vz=10V. Accordingly, the voltage Vout appearing outside of the cryostat is limited to Vz=10V. In this example, Vout=10V represents Vin=1000V. However, choice of the value of second resistor R2, according to a feature of the present invention example embodiment, allows this ratio to be changed.

Accordingly, the low-voltage connector 16 need only be capable of handling voltages up to Vz, typically no more than about 50V, rather than at least 5 kV, as was the case in the past.

This means that the connector may be made smaller than in the conventional arrangement, which in turn means that the connector places less of a insulation risk and thermal load on the cryostat.

Outside the cryostat, the voltage measuring equipment 24, such as a data logger, is arranged to detect voltages Vout at the connector 16. The voltage measuring equipment 24 need only be able to measure voltages up to Vz, such as 10V-50V. Yet, according to the present invention example embodiment, by appropriate selection of the resistance of second resistor R2, low voltages in the microvolt range can be clearly distinguished from noise, being applied to the measurement equipment without significant attenuation, while quench voltages of several kilovolts may be reliably and safely detected.

In preferred exemplary embodiments of the invention, the measuring equipment 24 is provided with an indication of the value of the resistance of second resistor R2, and uses this indication to scale the measured value of output voltage Vout to provide a direct indication of the coil node voltage Vin. The measurement equipment 24 may be adapted, for example by programming of a digital measurement system, or by appropriate hardware construction, to interpret the received values of Vout as the corresponding values of Vin. In this way, very large voltages of several kilovolts can be reliably measured, as can very small voltages of several microvolts.

The resistor R2 may be selected from among a range of discrete resistors provided for the purpose. Alternatively, a switched circuit may be used to select the required connection to a bank of resistors. Alternatively, R2 may be a potentiometer arrangement, with a continuously-variable resistance. In such embodiments, the potentiometer is preferably calibrated so that the resultant attenuation ratio is known. The potentiometer, switched resistors or discrete resistors may be labelled with attenuation ratios, to facilitate interpretation of the measured voltages. One discrete resistor, switch position, or potentiometer position, may correspond to open circuit, allowing a ratio of Vout=Vin to be selected.

FIG. 4 shows another, more complete, embodiment of the invention. In FIG. 4, the complete electrical circuit of the superconducting coils 110, 112, 114, 116, 118 is shown, along with superconducting switch 120 which is arranged to close the circuit of coils when operating in persistent mode, to form a closed superconducting circuit of coils 110, 112, 114, 116, 118 and superconducting switch 120.

At each node 122, 124, 126, 128, 130, a corresponding series resistor R1 is connected, linking the node to a low-voltage connector 16, which provides access from outside the cryostat boundary 18. Each of the low-voltage connectors 16 may be connected to voltage measurement equipment 24. A single voltage measurement system 24 may be provided, having multiple input channels, each connected to one low-voltage connector 16. Between each series resistor R1 and the corresponding connector 16 is a node 22. To each node 22 is connected a non-linear element 20, which is grounded. To each low-voltage connector 16, a grounded second resistor R2 is connected, at least while the output voltage Vout of the respective connector is being measured.

At each node 122, 124, 126, 128, 130, the circuitry R1, 20, R2, 16, 22 operates as described above with reference to FIG. 1 to provide scaled output voltages Vout up to a certain limiting value set by the threshold Vz of the non-linear element 20. The scaling factor is selectable by a user by selecting the resistance of second resistor R2 which is positioned, or at least is controllable, from outside of the cryostat.

If R2=∞ (open circuit), the voltage Vout at connector 16 equals the coil node voltage Vin, less any voltage drop across series resistor R1. The output impedance of such voltage equals the value of the resistor R1, and may be rather less than in conventional arrangements. A reduced value of series resistance R1 may be preferred, as lower resistances are less susceptible to noise.

When the scaled output voltage Vout at node 22 exceeds the threshold voltage Vz of the non-linear element 20, for example during a quench, the output voltage Vout will be limited to Vz by the non-linear element 20. The quench voltage will then essentially appear across the series resistor R1 which will dissipate power accordingly. This component need only dissipate this power for a few seconds since the quench voltage is a pulse of a few seconds duration, and so can be sized appropriately.

Examples of suitable non-linear elements 20 include voltage dependent resistors (VDR), zener diodes, a diode network or a transient voltage suppression (TVS) diode sometimes known as "Transorb".

Figure 6:
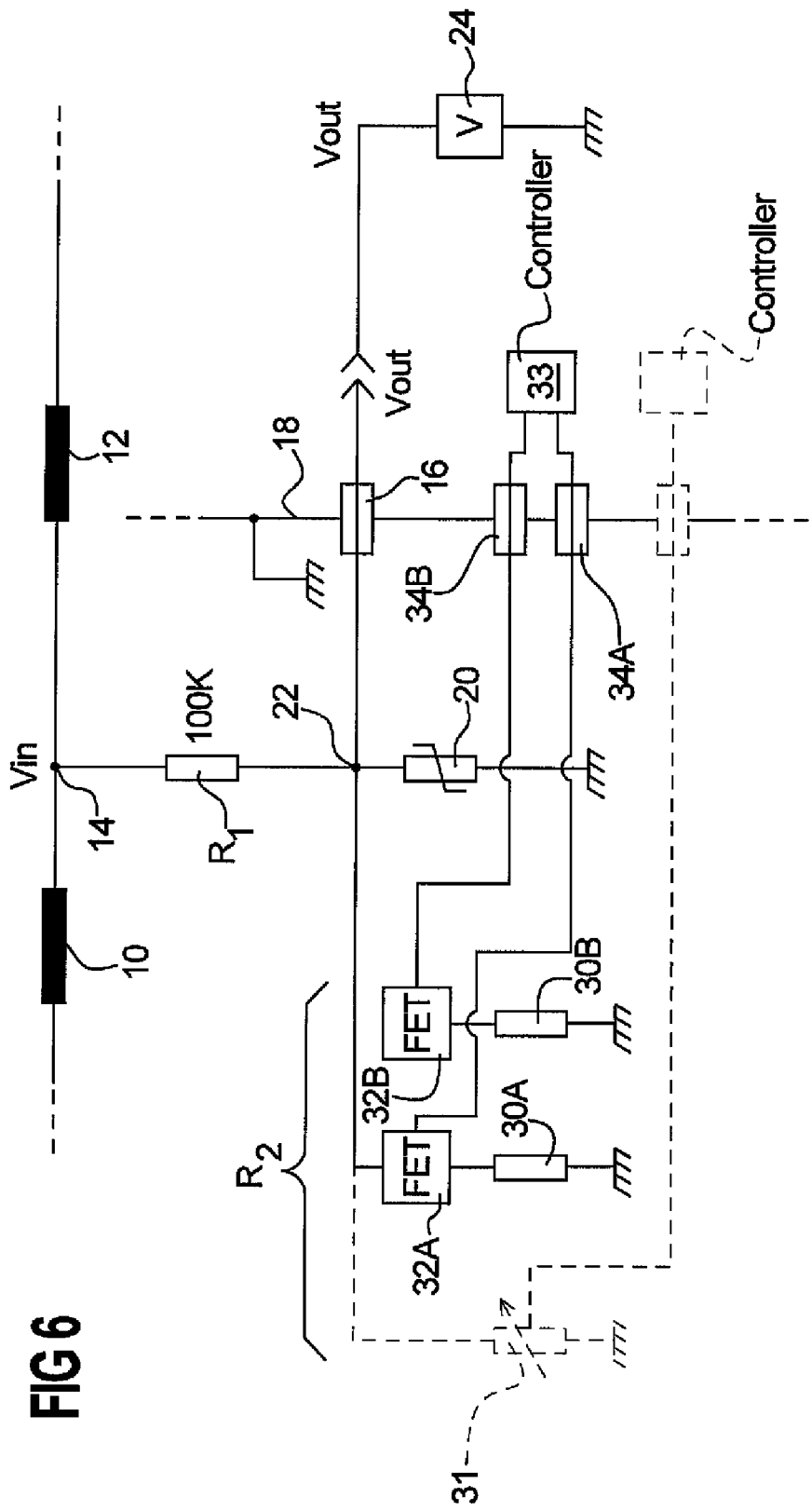
FIG. 6 shows alternative embodiments of the present invention.

In alternative embodiments shown in FIG. 6, selectable resistors 30A, 30B or a variable resistor 31 for use as second resistor R2 are located within the cryostat, such as being mounted on the coil assembly in proximity to the series resistor R1, provided that selection of the value of R2 may be performed externally to the cryostat. For example, field effect transistors (FETs) 32A, 32B may be provided to switch selected resistors 30A, 30B into the voltage divider, with control voltages applied to the FET gates from a controller 33 outside the cryostat, through electrical connectors 34A, 34B traversing the cryostat boundary 18. In such arrangements, the output voltage Vout is applied to the connector 16, and there is no need to provide selectable resistors externally to the cryostat.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

I claim as my invention:

1. A superconducting magnet assembly, comprising:
    a plurality of superconducting coils, joined in series, and housed within a cryostat;
    a coil node between two electrically adjacent of said superconducting coils providing an input voltage; and
    a coil node voltage output comprising
        a series resistor connected between the coil node and a further node,
        a non-linear element connected between the further node and a ground voltage, and
        an output connector electrically connected to the further node, and traversing a boundary of the cryostat.

2. A superconducting magnet assembly according to claim 1, further comprising a second resistor of selectable resistance, electrically connected between the connector and a ground voltage, whose resistance is selectable from outside of the cryostat.

3. A superconducting magnet assembly according to claim 2, wherein the second resistor is selected from among a range of discrete resistors.

4. A superconducting magnet assembly according to claim 2, wherein the second resistor is selected among a bank of resistors by a switched circuit.

5. A superconducting magnet assembly according to claim 2, wherein the second resistor is provided by a potentiometer arrangement, with a continuously-variable resistance.

6. A superconducting magnet assembly according to claim 2, wherein the second resistor is external to the cryostat.

7. A superconducting magnet assembly according to claim 4, wherein the bank of resistors are located within the cryostat, with field effect transistors provided to select among the resistors, with control voltages applied to gates of the field effect transistors from a controller outside the cryostat through electrical connectors traversing a boundary of the cryostat.

8. A superconducting magnet assembly according to claim 1 wherein the non-linear element is selected from among the following: a voltage dependent resistor, a zener diode, a diode network, and a transient voltage suppression diode.

9. A superconducting magnet assembly according to claim 1, comprising at least three superconducting coils electrically connected in series, wherein each coil node between pairs of electrically adjacent coils provides a corresponding input voltage; and wherein each coil node is provided with a coil node voltage output comprising
- a series resistor connected between the coil node and a further node,
- a non-linear element connected between the further node and a ground voltage, and
- an output connector electrically connected to the further node, and traversing a boundary of the cryostat.

10. A superconducting magnet assembly according to claim 9, further comprising a second resistor of selectable resistance, electrically connected between the connector of the coil node voltage output and the ground voltage, whose resistance is selectable from outside of the cryostat.

* * * * *